US012658249B2

(12) United States Patent
Fujiwara et al.

(10) Patent No.: US 12,658,249 B2
(45) Date of Patent: *Jun. 16, 2026

(54) SHARED POWER FOOTER CIRCUIT

(71) Applicant: Taiwan Semiconductor Manufacturing Company, Ltd., Hsinchu (TW)

(72) Inventors: Hidehiro Fujiwara, Hsin-chu (TW); Kao-Cheng Lin, Taipei City (TW); Wei Min Chan, Sindian City (TW); Yen-Huei Chen, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 143 days.

This patent is subject to a terminal disclaimer.

(21) Appl. No.: 18/601,512

(22) Filed: Mar. 11, 2024

(65) Prior Publication Data

US 2024/0212747 A1 Jun. 27, 2024

Related U.S. Application Data

(63) Continuation of application No. 17/119,357, filed on Dec. 11, 2020, now Pat. No. 11,961,554.

(60) Provisional application No. 62/968,444, filed on Jan. 31, 2020.

(51) Int. Cl.
| | |
|---|---|
| *G11C 11/412* | (2006.01) |
| *G11C 11/418* | (2006.01) |
| *H03K 17/687* | (2006.01) |
| *G11C 11/419* | (2006.01) |

(52) U.S. Cl.
CPC .......... *G11C 11/418* (2013.01); *G11C 11/412* (2013.01); *H03K 17/6871* (2013.01); *G11C 11/419* (2013.01)

(58) Field of Classification Search
CPC ... G11C 11/418; G11C 11/412; G11C 11/419; G11C 5/148; G11C 11/417; G11C 5/147; G11C 11/413; H03K 17/6871
See application file for complete search history.

(56) References Cited

U.S. PATENT DOCUMENTS

| | | | |
|---|---|---|---|
| 5,781,491 | A | 7/1998 | Lee et al. |
| 7,793,130 | B2 | 9/2010 | Yang et al. |
| 8,669,800 | B2 | 3/2014 | Behrends et al. |
| 9,378,805 | B2 | 6/2016 | Walsh et al. |
| 9,720,434 | B2 | 8/2017 | Myers et al. |
| 10,193,536 | B2 | 1/2019 | Agarwal et al. |
| 11,145,359 | B2 | 10/2021 | Kumar et al. |
| 11,152,046 | B1 | 10/2021 | Raszka et al. |
| 11,961,554 | B2 | 4/2024 | Fujiwara et al. |
| 2003/0102904 | A1 | 6/2003 | Mizuno et al. |

(Continued)

*Primary Examiner* — Khamdan N. Alrobaie
(74) *Attorney, Agent, or Firm* — Merchant & Gould P.C.

(57) ABSTRACT

A device includes a first power rail for a first power domain and a second power rail for a second power domain. A first circuit block is connected to the first power rail and a second circuit block is connected to the second power rail. The first and second circuit blocks are both connected to a virtual VSS terminal. A footer circuit is connected between the virtual VSS terminal and a ground terminal, and the footer circuit is configured to selectively control a connection between the virtual VSS terminal and the ground terminal.

20 Claims, 8 Drawing Sheets

(56)         References Cited

U.S. PATENT DOCUMENTS

| | | |
|---|---|---|
| 2004/0196724 A1 | 10/2004 | Chen et al. |
| 2006/0050590 A1 | 3/2006 | Nautiyal et al. |
| 2007/0081378 A1* | 4/2007 | Kawa ................. H03K 19/0016 |
| | | 365/100 |
| 2007/0159239 A1 | 7/2007 | Rhee |
| 2008/0272652 A1 | 11/2008 | Idgunji et al. |
| 2009/0001814 A1 | 1/2009 | Subramaniam |
| 2010/0039872 A1 | 2/2010 | Park et al. |
| 2010/0182850 A1* | 7/2010 | Shiu ...................... G11C 11/413 |
| | | 365/189.09 |
| 2010/0188922 A1* | 7/2010 | Nakaoka ................ G11C 5/147 |
| | | 365/227 |
| 2010/0308897 A1 | 12/2010 | Evoy et al. |
| 2011/0292753 A1 | 12/2011 | Hsu et al. |
| 2015/0249449 A1 | 9/2015 | Cai et al. |
| 2017/0346485 A1 | 11/2017 | Chen et al. |
| 2020/0327927 A1 | 10/2020 | Kumar et al. |

* cited by examiner

SHARED POWER FOOTER CIRCUIT

CROSS REFERENCE TO RELATED APPLICATION

This application is a continuation application of Ser. No. 17/119,357, filed Dec. 11, 2020, which claims the benefit of U.S. Provisional Application No. 62/968,444, filed Jan. 31, 2020, and titled "Shared Footer for Different Power Domains," the disclosures of which are hereby incorporated herein by reference.

BACKGROUND

Some electronic devices employ multiple power domains, for example, to reduce power consumption. For instance, different sections of the device may be powered with different supply voltage levels depending on their specific power requirements. Some memory architectures, such as static random access memory (SRAM) devices, use multiple power domains. Some SRAM arrangements operate the memory array in a high voltage domain, while operating peripheral circuits such as the memory I/O, control, etc. in different voltage domains. Further, various techniques may be employed to reduce power consumption. For example, portions of the memory device may be turned off during a sleep, or shutdown mode. Power gating and voltage retention techniques are commonly implemented to the memory array to reduce power consumption. For example, power gates may be used to turn off memory periphery items in a deep sleep mode, and both the periphery items and the memory array in a shut down mode. When the memory comes out of the shut down mode, power gates are used to ramp up the internal supply voltage of the memory

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
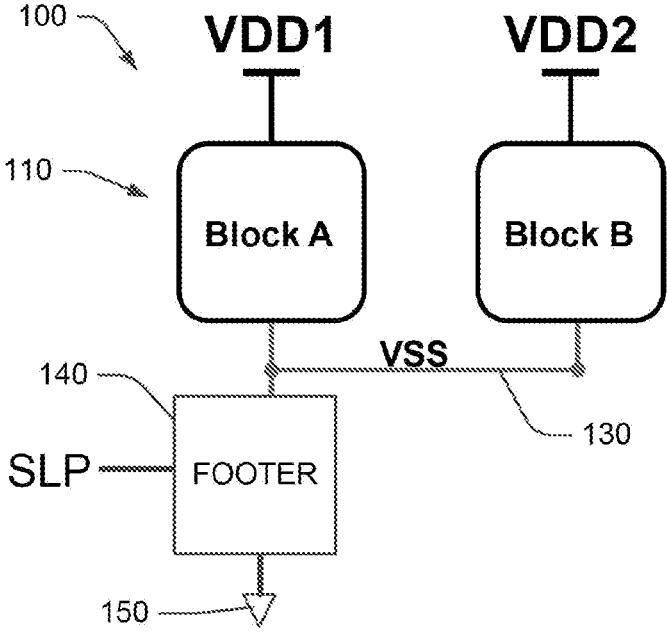
FIG. 1 is a block diagram illustrating an electronic device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic devices can have different portions powered selectively by different power supply levels or power domains. Such devices may use different power domains to power different portions of the device depending on power requirements. For example, a section of an integrated circuit (IC) that performs computation can be powered at a lower supply voltage than a section of the IC devoted to an input-output (I/O) interface. Dynamic voltage scaling (DVS) is used to vary the supply voltage of sections of the IC based on a mode of operation, can also be used. For example, a memory component may be operated at a higher supply voltage during a write operation than during a read operation.

A memory device, such as but not limited to a static random access memory (SRAM) device, is an example of such an electronic device. SRAM memory has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information. In some SRAM arrangements, peripheral devices such as memory logic and I/O may be operated in a low voltage domain(s), while the memory array may be operated in a higher voltage domain.

Further, devices such as SRAM memories have multiple power management modes. For example, in a shut-down mode, the memory array of the memory device (where information is stored), as well as circuits peripheral to the memory array, are turned off to conserve power. However, while SRAM maintains data in the memory array without the need to be refreshed when powered, it is volatile such that data is eventually lost when the memory is not powered. In situations where it is necessary to maintain data stored by the memory device, a sleep power management mode may be used, where power is conserved while maintaining stored information. In a sleep mode, power to the memory array is maintained, while devices or circuits peripheral to the memory such as I/O circuits and other control circuits are turned off.

Power gates are used to turn off the peripheral devices during the deep sleep mode, and are also used to turn off both the periphery and memory array during the sleep or shut-down mode. When the memory comes out of the sleep or shut-down mode, the power gates are used to ramp up internal supply voltages of the memory device.

Power gating is an integrated circuit design technique to reduce power consumption by shutting off the current to blocks of a circuit that is not in use. Typically power gating can be implemented using header switches to shut off power supplies to parts of a design in standby or sleep mode. Power gating helps reduce standby or leakage power. However, power gating may affect the architecture design and may cause increases in area due to metal tracks used for routing.

As noted above, various circuit blocks of electronic devices also may include a plurality of power domains that are used to reduce power consumption. Some arrangements include multiple power management groups, each of which includes one or more circuit blocks. The circuit blocks within these power management groups may be powered by different supply voltage levels, or power domains. In some known arrangements, the circuit blocks within the power management groups are connected to a power rail corresponding to the appropriate power domain though a header circuit, or "virtual power rail." In other words, each of the circuit blocks has a corresponding header circuit to control connection of the circuit block to its respective power rail. As such, if N power domains are employed (where N is a positive integer), at least 2N+1 power rails are required: N power rails for the N respective power domains, respective N virtual power rails (i.e. header circuits), and a ground or VSS rail. Such arrangements can complicate power routing in metal layers of an IC device, and also result in a weaker power network.

In accordance with disclosed aspects, a footer circuit controls connection of a virtual VSS terminal to a ground terminal, for example, to implement sleep or shut down modes. Further, the footer circuit is shared among circuit blocks operating in different power domains, providing a more robust, yet simpler power network.

FIG. 1 illustrates an electronic device in accordance with some disclosed embodiments. In general, the device 100 includes a plurality of circuit blocks 110. In FIG. 1, the circuit blocks 110 include a first circuit block A and a second circuit block B. The device 100 further includes a first power rail VDD1 for a first power domain and a second power rail VDD2 for a second power domain. In other words, the first and second power rails VDD1 and VDD2 receive signals having different voltage levels corresponding to the first and second power domains, respectively. The first circuit block A operates in the first power domain and thus is connected to the first power rail, and the second circuit block B operates in the second power domain and as such is connected to the second power rail VDD2. A virtual VSS terminal 130 is connected to both the first and second circuit blocks A and B. In other words, the circuit block A is connected between the VDD1 terminal and the virtual VSS terminal, while the circuit block B is connected between the VDD2 terminal and the virtual VSS terminal. A footer circuit 140 is connected between the virtual VSS terminal 130 and a ground terminal 150, and is configured to selectively control a connection between the virtual VSS terminal 130 and the ground terminal 150. In this manner, the virtual VSS terminal 130 and the footer circuit 140 are shared by the first and second circuit blocks A and B. In some implementations, the footer circuit 140 is configured to disconnect the virtual VSS terminal 130 from the ground terminal 150 in response to a footer control signal SLP. For example, the footer control signal SLP may be a sleep signal configured to put the device 100 into a sleep or shut down mode. In this state, the footer circuit 140 disconnects the virtual VSS terminal 130 from the ground terminal 150 such that the virtual VSS terminal 130 is floating, thus interrupting the current path between the first power rail VDD1 and ground 150, as well as the current path between the second power rail VDD2 and ground 150.

Figure 2:
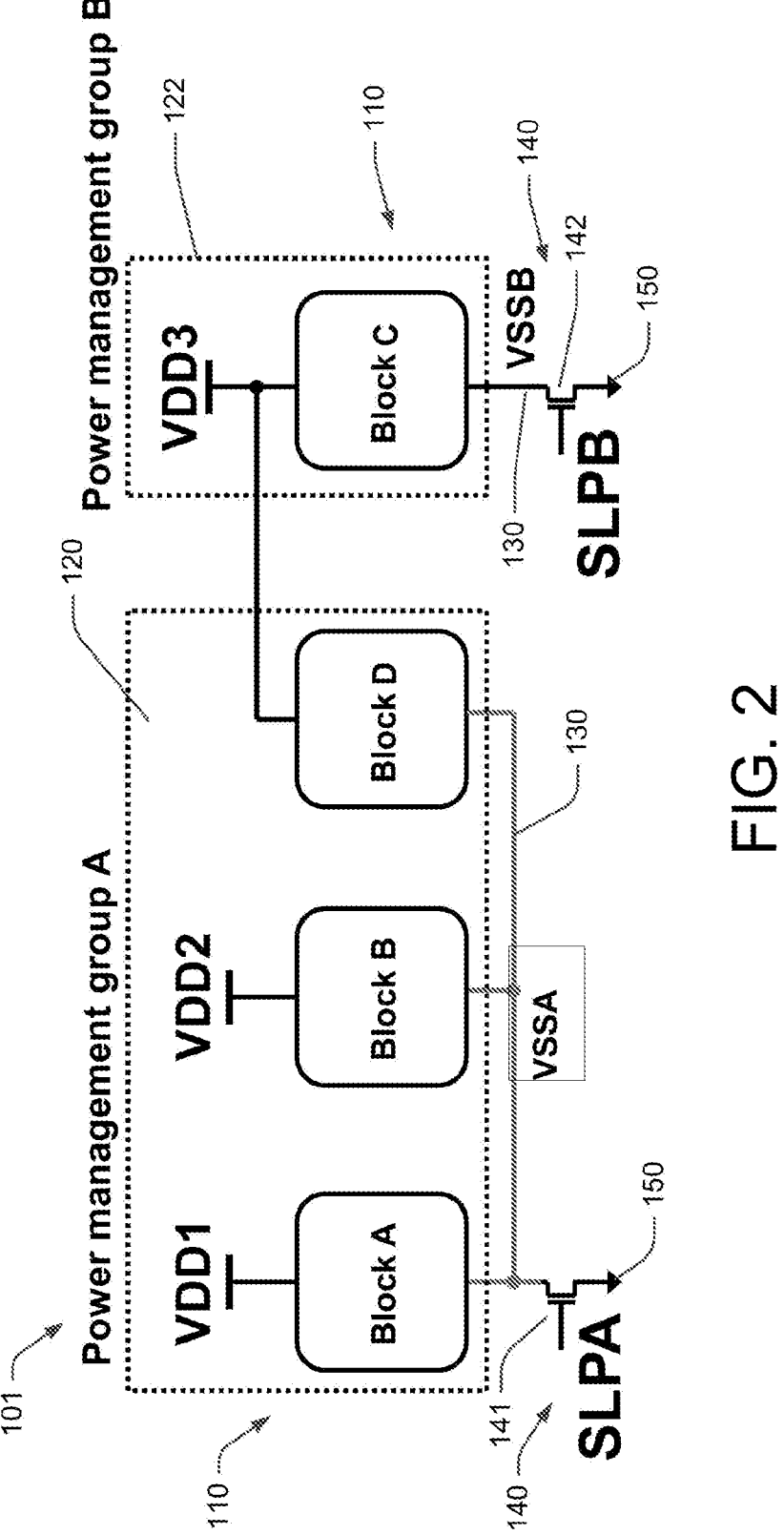
FIG. 2 is a block diagram illustrating another electronic device in accordance with some embodiments.

FIG. 2 illustrates another device 101 in accordance with further examples. In the example of FIG. 2, the circuit blocks 110 are parts of first or second power management groups 120 and 122. The first and second power management groups 120 and 122 may be configured so as to have power controlled independently of one another. As noted above, some devices may have a shut down mode where all circuit blocks 110 are shut down to conserve power. Such devices may further have a sleep mode, where some circuits are turned off, while others remained powered. To provide independent power control of the first and second power management groups 120 and 122, the virtual VSS terminal 130 includes a first virtual VSS terminal VSSA for the first power management group 120, and a second virtual VSS terminal VSSB for the second power management group 122.

In FIG. 2, the footer circuit 140 includes first and second footer circuits. More particularly, the footer circuit 140 has first and second switches, which in the example of FIG. 2 are respective first and second n-type metal-oxide-semiconductor (NMOS) transistors 141 and 142. Other types of switches are within the scope of this disclosure. The NMOS transistors 141 and 142 each have their gate terminal connected to receive respective control signals SLPA and SLPB. The SLPA signal thus operates to control the transistor 141 for selective connection and disconnection of the circuit block(s) 110 of the first power management group 120 to the ground terminal 150. Similarly, the SLPB signal operates to control the transistor 142 for selective connection and disconnection of the circuit block(s) 110 of the second power management group 122 to the ground terminal 150.

The first power management group 120 of the device 101 includes the circuit blocks A and B, which are connected to the VDD1 and VDD2 power rails, respectively. The circuit blocks A and B are both connected to the first virtual VSS terminal VSSA, which is selectively connected to the ground terminal 150 by operation of the transistor 141. The second power management group 122 includes a third circuit block C, which operates in a third power domain. As such, the circuit block C is connected to a third power rail VDD3, which receives a voltage signal for the third power domain. The circuit block C is connected to the second virtual VSS terminal VSSB. As noted above, the second power management group connection to ground is thus controlled in response to the second footer control signal SLPB, which biases the transistor 142 to selectively connect the VSSB terminal to the ground terminal 150.

In the example of FIG. 2, the first power management group 120 further includes a fourth circuit block D, which also operates in the third power domain. As such, the circuit block D is connected to the VDD3 power rail. Since the circuit block D is part of the first power management group 120, its power is controlled together with the other circuit blocks 110 of the first power management group 120. Therefore, the circuit block D is connected to the VSSA terminal. Accordingly, circuit block A, circuit block B, and circuit block D are all selectively connected to the ground terminal 150 through operation of the transistor 141 in response to the SLPA signal. Circuit block C of the second power management group 122, which is connected to the second virtual VSS terminal VSSB, is selectively connected to the ground terminal 150 through operation of the transistor 142 in response to the SLPB signal.

Figure 3:
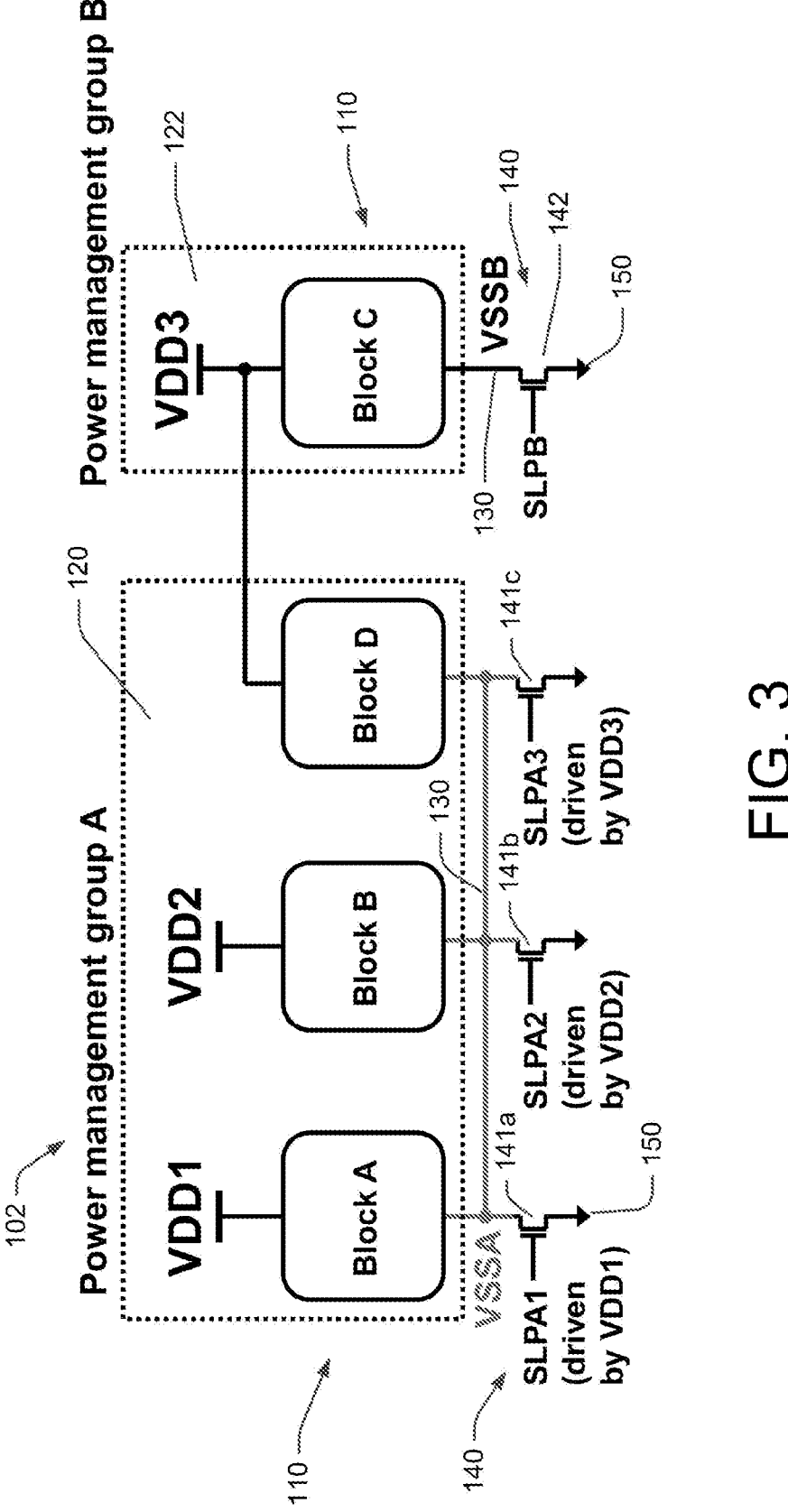
FIG. 3 is a block diagram illustrating a further electronic device in accordance with some embodiments.

FIG. 3 illustrates another device 102. Similarly to the device 101 shown in FIG. 2, the device 102 has the first and second power management groups 120 and 122 which are configured so as to have power controlled independently of one another. The first power management group 120 has circuit block A, circuit block B and circuit block D, while the second power management group 122 has the circuit block C. Circuit block A, circuit block B and circuit block D are each connected to the first virtual VSS terminal VSSA, while the circuit block C is connected to the VSSB terminal. The VSSB terminal is selectively connected to the ground terminal 150 by the transistor 142 in response to the SLPB control signal.

Connection of the VSSA terminal to the ground terminal 150 is controlled by respective NMOS transistors 141$a$, 141$b$ and 141$c$. Moreover, the NMOS transistors 141$a$, 141$b$ and 141$c$ have their gate terminals respectively connected to receive control signals SLPA1, SLPA2 and SLPA3. The voltage levels of the control signals SLPA1, SLPA2 and SLPA3 correspond to their respective power domains. In other words, the logic high gate signal for the transistor 141$a$ is at the VDD1 level, the logic high gate signal for the transistor 141$b$ is at the VDD2 level, and the logic high gate signal for the transistor 141$c$ is at the VDD3 level. As such, each of the transistors 141$a$, 141$b$ and 141$c$ of the footer circuit 140 receive a gate signal at its respective full VDD voltage level. Such an arrangement may be desirable, for example, to ensure that each of the transistors 141$a$, 141$b$ and 141$c$ fully turns on when the VSSA terminal is to be connected to the ground terminal 150.

Figure 4:
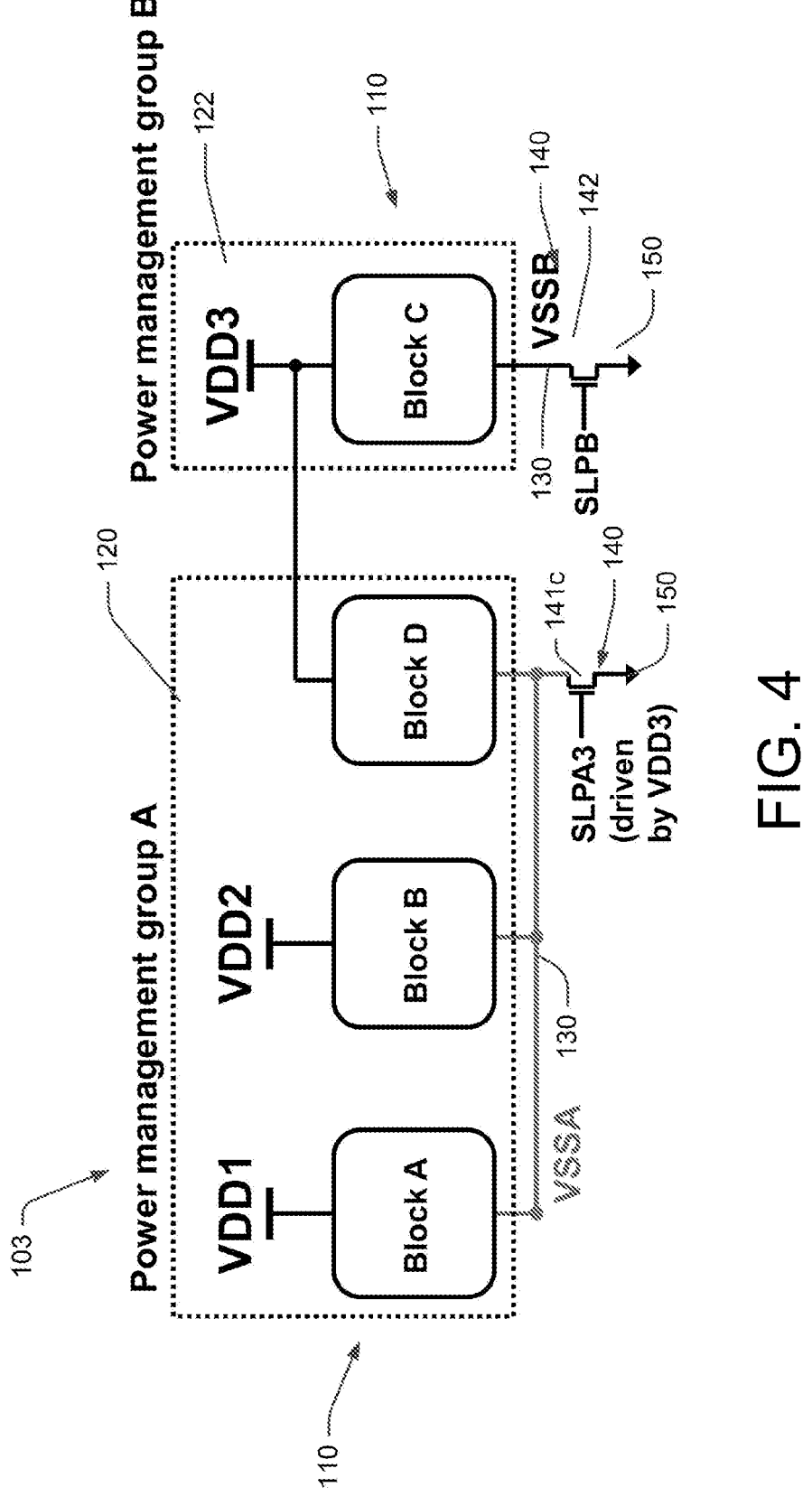
FIG. 4 is a block diagram illustrating yet another electronic device in accordance with some embodiments.

FIG. 4 shows yet another device 103, that also has the first and second power management groups 120 and 122 configured to have power controlled independently of one another. The first power management group 120 has circuit block A, circuit block B and circuit block D, while the second power management group 122 has the circuit block C. Circuit block A, circuit block B and circuit block D are each connected to the VSSA terminal, while the circuit block C is connected to the VSSB terminal. The VSSB terminal is selectively connected to the ground terminal 150 by the transistor 142 in response to the SLPB control signal.

In the example of FIG. 4, connection of the VSSA terminal to the ground terminal 150 is controlled by the power domain having the highest voltage level. In this manner, each of the transistors 141$a$, 141$b$ and 141$c$ receives a gate signal that is at least as high as its respective VDD level. Again, this ensures the NMOS transistors 141$a$, 141$b$ and 141$c$ fully turns on to connect the VSSA terminal to the ground terminal 150. This, in turn, ensures a good connection of each of the circuit block A, circuit block B and circuit block D to the ground terminal 150. In the example device 103, the third power domain has the highest voltage level. Thus, the NMOS transistor 141$c$ is connected between the VSSA terminal and the ground terminal, and receives the SLPA3 signal at the VDD3 level at its gate.

Figure 5:
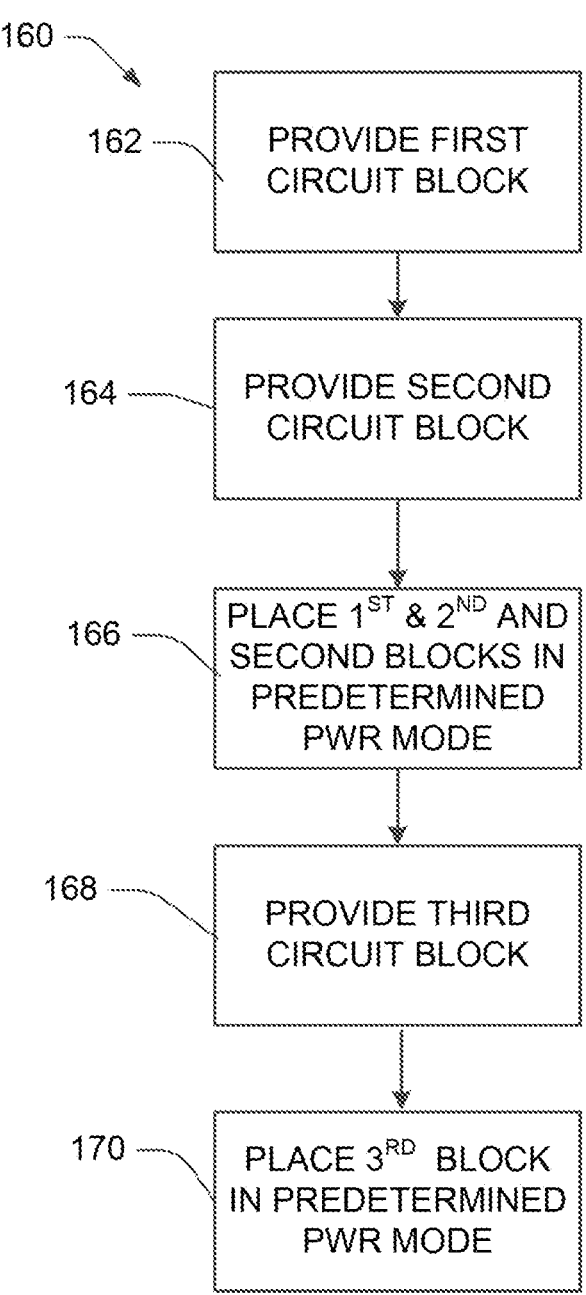
FIG. 5 is a flow diagram illustrating a method in accordance with some embodiments.

FIG. 5 illustrates a method for operating an electronic device corresponding to the devices illustrated in FIGS. 1-4. Step 162 of the method 160 includes providing a first circuit block, such as circuit block A connected between the a first virtual VSS terminal VSSA and a first power rail VDD1 to operate in a first power domain. Step 164 includes providing a second circuit block, such as the circuit block B connected between the first virtual VSS terminal VSSA and a second power rail VDD2 to operate in a second power domain. In step 166, the first and second circuit blocks are placed in a predetermined power mode, such as a shut down or sleep mode, by controlling a connection between the first virtual VSS terminal VSSA and a ground terminal 150 in response to a first footer control signal SLPA. In some embodiments, controlling the connection between the first virtual VSS terminal VSSA and the ground terminal 150 includes applying the first footer control signal SLPA to a first footer circuit 141 connected between the first virtual VSS terminal VSSA and the ground terminal 150.

Step 168 includes providing a third circuit block, such as the circuit block C connected between a second virtual VSS terminal VSSB and a third power rail VDD3 to operate in a third power domain. In step 170, the third circuit block C is placed in the predetermined power mode by controlling a connection between the second virtual VSS terminal VSSB and the ground terminal 150 in response to a second footer control signal SLPB. In some examples, controlling the connection between the second virtual VSS terminal VSSB and the ground terminal 150 includes applying the second footer control signal SLPB to a second footer circuit 142 connected between the second virtual VSS terminal VSSB and the ground terminal 150.

Figure 6:
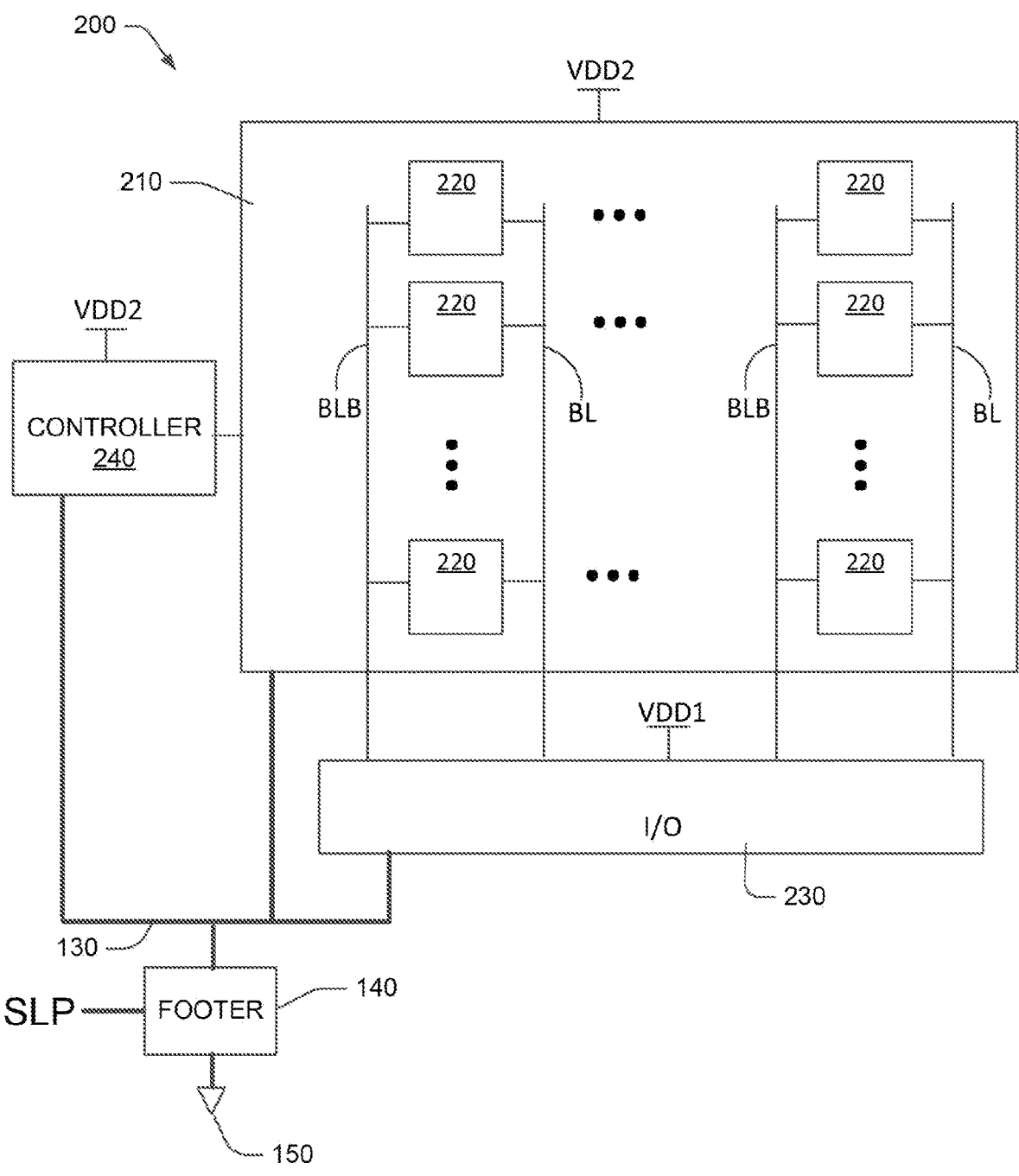
FIG. 6 is a block diagram illustrating a memory device in accordance with some embodiments.

The devices 100-103 shown in FIGS. 1-4 could be essentially any type of electronic device employing multiple power domains and using power control for shut down, sleep, etc. power modes. As noted above, one example device is an SRAM memory. An example SRAM memory device 200 is shown in FIG. 6. In the example shown, the memory device 200 includes a memory array 210, the memory array 210 including a plurality of memory cells 220. The memory device 200 also includes peripheral circuits including an I/O circuit 230 and a memory controller 240. The memory cells 220 and the I/O circuit 230 may be coupled by complementary bit lines BL and BLB, and data can read from and written to the memory cells 220 via the complementary bit lines BL and BLB. In the illustrated example, peripheral circuits 230 and 240 operate in the first power domain and thus are connected to the VDD1 power rail, while the memory array 210 operates in the second, higher power domain and is therefore connected to the VDD2 power rail. The memory array 210, I/O 230 and controller 240 are all connected to the virtual VSS terminal 130, which is selectively connected to the ground terminal 150 by the footer circuit 140 in response to the control signal SLP. More particularly, for normal operation of the SRAM memory device the footer 140 is operated by the SLP signal to connect the virtual VSS terminal 130, and thus the controller 240, memory array 210, and I/O circuit 230 to the ground terminal 150. In a shut down or sleep power mode, for example, the virtual VSS terminal 130, and thus one or more of the controller 240, memory array 210, and I/O circuit 230 may be disconnected from the ground terminal 150 by providing the appropriate control signal SLP to the footer 140 to disconnect the virtual VSS terminal 130 from the ground terminal 150.

Figure 7:
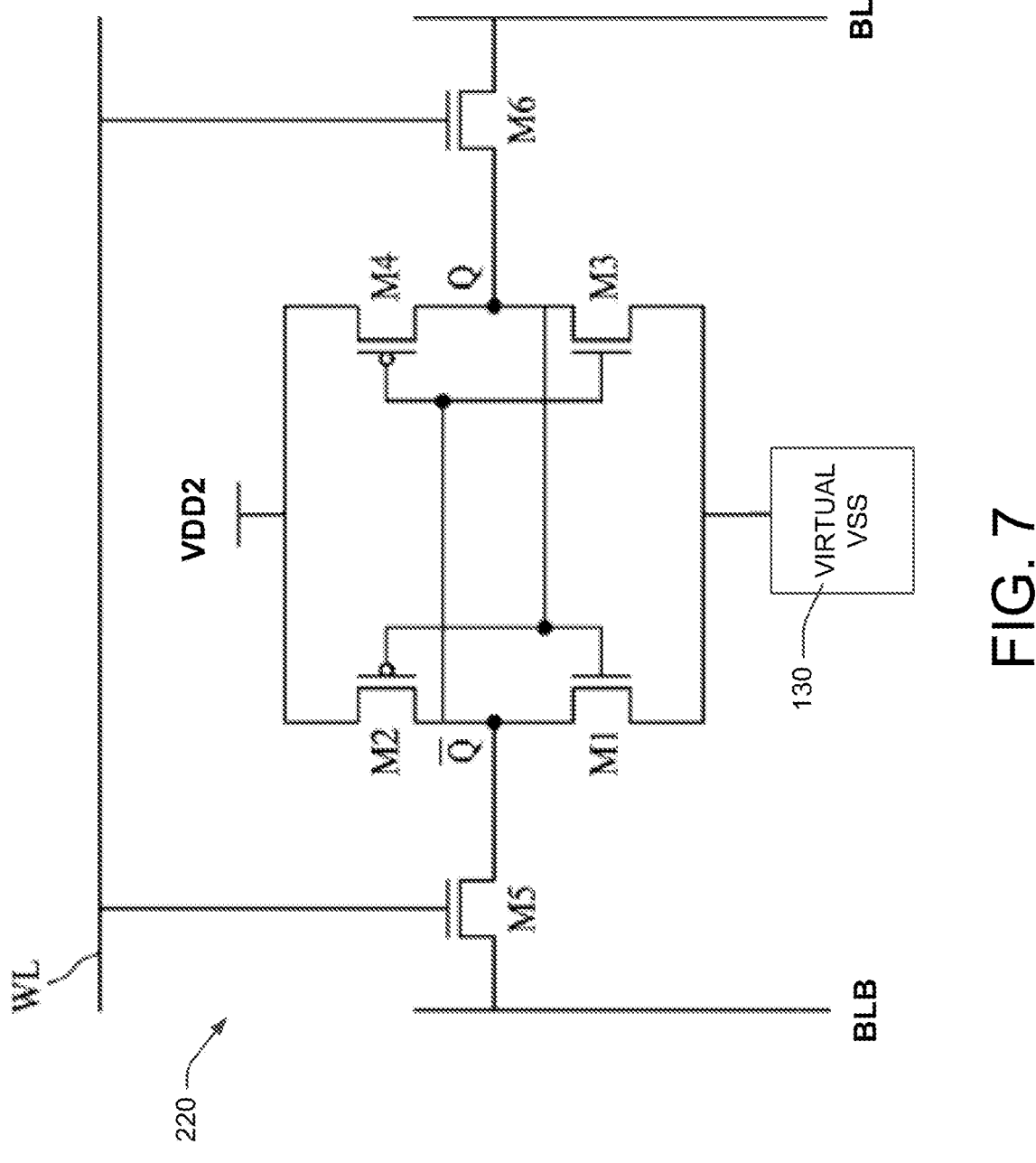
FIG. 7 is a circuit diagram illustrating an example of a memory cell of the memory device of FIG. 6 in accordance with some embodiments.

FIG. 7 is a circuit diagram illustrating an example of the memory cell 220 in accordance with some embodiments. The memory cell 220 includes but is not limited to a six-transistor (6 T) SRAM structure. In some embodiments more or fewer than six transistors may be used to implement the memory cell 220. For example, the memory cell 220 in some embodiments may use a 4 T, 8 T or 10 T SRAM structure, and in other embodiments may include a memory-like bit-cell or a building unit. The memory cell 220 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include NMOS transistors, and transistors M2 and M4 include p-type metal-oxide semiconductor (PMOS) transistors.

The first and second inverters are cross coupled to each other to form a latching circuit for data storage. A first terminal of each of transistors M2 and M4 is coupled to the power rail for the appropriate power domain, which is the VDD2 power rail in the illustrated example. A first terminal of each of transistors M1 and M3 is coupled to the virtual VSS terminal 130, which selectively connects to ground via the footer circuit as discussed above.

A gate of the pass gate transistor M6 is coupled to a word line WL. A drain of the pass gate transistor M6 is coupled to a bit line BL. Moreover, a first terminal of the pass gate transistor M6 is coupled to second terminals of transistors M4 and M3 and also to gates of M2 and M1 at the node Q. Similarly, a gate of the pass gate transistor M5 is coupled to the word line WL. A drain of the pass gate transistor M5 is coupled to a complementary bit line BLB. Moreover, a first terminal of the pass gate transistor M5 is coupled to second terminals of transistors M2 and M1 and also to gates of transistors M4 and M3 at the node Qbar.

In the example shown in FIG. 6, the memory array 210 and peripheral circuits 230 and 240 operate in different power domains. More particularly, the memory array 210 operates in the second power domain and is therefore connected to the VDD2 power rail, while the peripheral circuits 230 and 240 operate in the first power domain and are therefore connected to the VDD1 terminal. Further, if the memory device 200 is to be placed in a shut down mode, for example, the footer circuit 140 disconnects the virtual VSS terminal 130 from the ground terminal 150, such that the virtual ground terminal 130 is floating.

Figure 8:
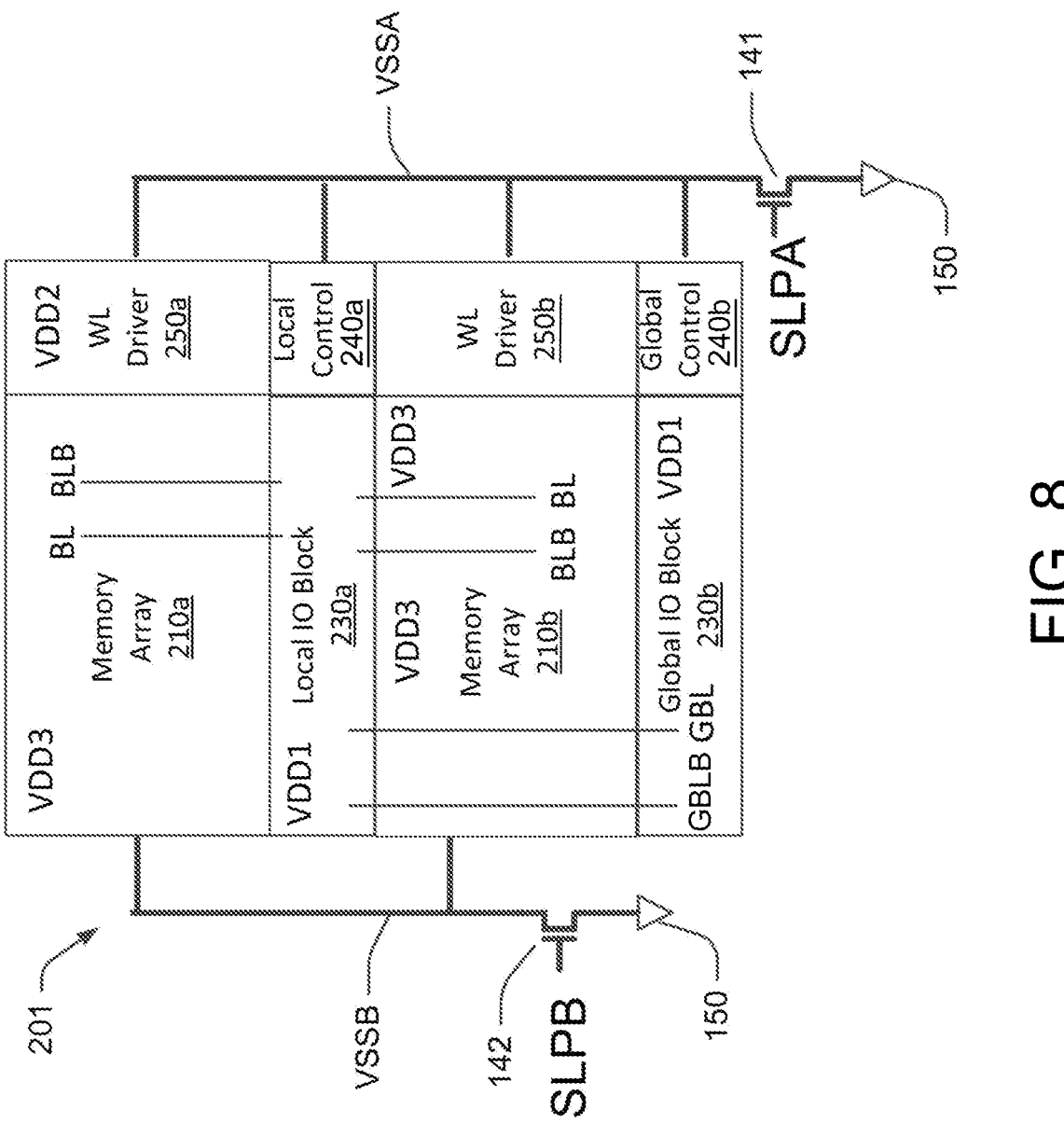
FIG. 8 is a block diagram illustrating another memory device in accordance with some embodiments.

Some SRAM devices have the memory array 210 arranged in multiple memory banks. A block diagram showing an example of aspects of such a device 201 is shown in FIG. 8. In the embodiment of FIG. 8, the memory device 201 includes the memory cell array 210 that is separated into sub-arrays 210a and 210b. Only 2 sub-arrays are shown for simplicity, though other implementations could include additional sub-arrays. The memory device 201 further includes peripheral circuits such as a local I/O circuit 230a, a local controller 240a, a global I/O circuit 230b, and a global controller 240b.

As noted above, the memory arrays 210a and 210b include a plurality of memory cells 220, such as those shown in FIG. 6 connected to word lines and the complementary bit lines BL and BLB (schematically shown in FIG. 7 for ease of illustration). The bit lines BL and BLB of the memory arrays 210a and 210b are connected to the local I/O circuit 230a. The local I/O 230a is connected to the global I/O 230b by complementary global bit lines GBL and GBLB. The global I/O 230b functions to transfer data between memory cells and other circuits outside of the memory device 201.

In the illustrated example, the memory arrays 210a and 210b operate in the highest power domain and as such are connected to the VDD3 rail. The word line drivers 250a and 250b, the local controller 240a and the global controller 240b operate in the second power domain and are thus connected to the VDD2 power rail. The local I/O block 230a and the global I/O block 230b operate in the lowest power domain and are therefore connected to the VDD1 power rail.

As noted above, the SRAM memory cells 220 are volatile in that data is eventually lost when the memory is not powered. In situations where it is necessary to maintain data stored by the memory device, a sleep power management mode may be used, where power is conserved while maintaining stored information. In such a sleep mode, power to the memory array 210a and 210b is maintained, while the peripheral circuits including the local I/O circuit 230a, local controller 240a, global I/O circuit 230b, and global controller 240b are turned off.

Accordingly, the local I/O circuit 230a, local controller 240a, global I/O circuit 230b, and global controller 240b are part of a first power management group and are thus connected to the VSSA terminal. The first footer circuit 141 connects the VSSA terminal to ground 150 in response to the first control signal SLPA. The memory arrays 210a and 210b comprise a second power management group and are therefore connected to the VSSB terminal. The second footer circuit 142 connects the VSSB terminal to ground 150 in response to the second control signal SLPB.

Thus, to place the memory device 201 in a first power mode such as a shut down mode, both the SLPA and SLPB control signals are brought low to turn off the NMOS transistors 141, 142, disconnecting the VSSA terminal and VSSB terminal from the ground terminal 150.

To place the memory device 201 in a second power mode such as a sleep mode, the SLPA control signal is brought low to turn off the NMOS transistor 141 to disconnect the VSSA terminal from the ground terminal 150. However, the SLPB control signal is kept high so the NMOS transistor 142 stays on, maintaining the connection of the VSSB terminal to the ground terminal 150.

The present disclosure thus provides a robust yet simple power network in which a footer circuit and virtual VSS terminal that are shared by different circuit blocks of a device. The circuit blocks operate in different power domains. The shared footer circuit and virtual VSS terminal control connection of the circuit blocks to a ground terminal, for example, to implement sleep or shut down modes.

Certain disclosed embodiments include a device with a first power rail for a first power domain and a second power rail for a second power domain. A first circuit block is connected to the first power rail and a second circuit block is connected to the second power rail. The first and second circuit blocks are both connected to a virtual VSS terminal. A footer circuit is connected between the virtual VSS terminal and a ground terminal, the footer circuit is configured to selectively control a connection between the virtual VSS terminal and the ground terminal.

In accordance with further embodiments, a device includes a first power rail for a first power domain, a second power rail for a second power domain, and a third power rail for a third power domain. A first footer circuit connected is between a first virtual VSS terminal and a ground terminal. The first footer circuit is configured to selectively control a connection between the first virtual VSS terminal and the ground terminal in response to a first footer control signal. A first circuit block is connected between the first power rail and the first virtual VSS terminal. A second circuit block is connected between the first power rail and the first virtual VSS terminal. A second footer circuit is connected between a second virtual VSS terminal and the ground terminal. The second footer circuit is configured to selectively control a connection between the second virtual VSS terminal and the ground terminal in response to a second footer control signal. A third circuit block is connected between the second power rail and the second virtual VSS terminal.

In accordance with still further disclosed aspects, a method includes providing a first circuit block connected between a first virtual VSS terminal and a first power rail to operate in a first power domain. A second circuit block is provided that is connected between the first virtual VSS terminal and a second power rail to operate in a second power domain. The first and second circuit blocks are placed in a predetermined power mode by controlling a connection between the first virtual VSS terminal and a ground terminal in response to a first footer control signal. A third circuit block is provided that is connected between a second virtual VSS terminal and a third power rail to operate in a third power domain. The third circuit block is placed in the predetermined power mode by controlling a connection between the second virtual VSS terminal and the ground terminal in response to a second footer control signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first power rail for a first power domain;
a second power rail for a second power domain, wherein the second power rail is different from the first power rail;
a first circuit block connected to the first power rail;
a second circuit block connected to the second power rail;
a virtual VSS terminal, wherein the first and second circuit blocks are both connected to the virtual VSS terminal;
a ground terminal;
a footer circuit connected between the virtual VSS terminal and the ground terminal;
a first footer circuit configured to receive a first footer control signal in the first power domain; and
a second footer circuit configured to receive a second footer control signal in the second power domain.

2. The device of claim 1, wherein at least one of the first and second footer circuits is configured to control a connection of the virtual VSS terminal from the ground terminal in response to the first and second footer control signals, respectively.

3. The device of claim 1, wherein the virtual VSS terminal includes first and second virtual VSS terminals, wherein the first footer control signal controls a connection between the first virtual VSS terminal and the ground terminal, and wherein the second footer control signal controls a connection between the second virtual VSS terminal and the ground terminal.

4. The device of claim 1, wherein the first footer circuit includes a first footer circuit transistor and the second footer circuit includes a second footer circuit transistor, and wherein a connection of the virtual VSS terminal to the ground terminal is controlled by at least one of the first and second footer circuit transistors.

5. The device of claim 1, further comprising:
a third power rail for a third power domain; and
a third circuit block connected between the third power rail and the virtual VSS terminal.

6. The device of claim 5, further comprising:
a third footer circuit connected between the virtual VSS terminal and the ground terminal, the third footer circuit configured to receive a third footer control signal driven by the third power domain.

7. The device of claim 5, wherein the virtual VSS terminal includes first and second virtual VSS terminals, wherein the first footer control signal controls a connection between the first virtual VSS terminal and the ground terminal, wherein the second footer control signal controls a connection between the second virtual VSS terminal and the ground terminal, and wherein the first and third circuit blocks are both connected to the first virtual VSS terminal, and wherein the second circuit block is connected to the second virtual VSS terminal.

8. The device of claim 1, further comprising:
a fourth circuit block connected between the first power rail and the virtual VSS terminal.

9. The device of claim 8, further comprising:
a fourth footer circuit connected between the virtual VSS terminal and the ground terminal, the fourth footer circuit configured to receive a fourth footer control signal driven by the second power domain.

10. A memory device, comprising:
a first power rail for a first power domain;
a second power rail for a second power domain, and wherein the second power domain is different from the first power domain;
a memory array connected to the first power rail;
a first peripheral circuit connected to the second power rail;
a virtual VSS terminal, wherein the first peripheral circuit and the memory array are both connected to the virtual VSS terminal;
a ground terminal;
a footer circuit connected between the virtual VSS terminal and the ground terminal;
a first footer circuit configured to receive a first footer control signal; and
a second footer circuit configured to receive a second footer control signal.

11. The device of claim 10, wherein at least one of the first footer control signal and the second footer control signal is generated based on a predetermined power mode.

12. The device of claim 11, wherein the predetermined power mode includes at least one of a normal operation mode, a deep sleep mode, a sleep mode and a shutdown mode;
wherein the virtual VSS terminal includes a first virtual VSS terminal connected to the memory array, and a second virtual VSS terminal connected to the first peripheral circuit;
wherein in the normal operation mode, the first and second virtual VSS terminals are both connected to the ground terminal;
wherein in the sleep mode, the first virtual VSS terminal is connected to the ground terminal and the second virtual VSS terminal is disconnected to the ground terminal; and wherein in the deep sleep mode or the shutdown mode, the first and second virtual VSS terminals are both disconnected to the ground terminal.

13. The device of claim 10, further comprising a second peripheral circuit connected to a third power rail having a third power domain, and the third power domain being the lowest power domain among the first, second and third power domains.

14. The device of claim 13, wherein each of the first and second peripheral circuits includes at least one of a local I/O circuit, a local controller, a global I/O circuit, and a global controller.

15. The device of claim 14, wherein the first peripheral circuit includes at least one of the local controller and the global controller, and wherein the second peripheral circuit includes at least one of the local I/O circuit and the global I/O circuit.

16. A method for operating a device, comprising:

providing a first circuit block connected between a first virtual VSS terminal and a first power rail to operate in a first power domain;

providing a second circuit block connected between a second virtual VSS terminal and a second power rail to operate in a second power domain, wherein the second power rail is different from the first power rail, and wherein the second power domain is different from the first power domain;

placing the first circuit block in a predetermined power mode by controlling a connection between the first virtual VSS terminal and a ground terminal in response to a first footer control signal; and placing the second circuit block in the predetermined power mode by controlling a connection between the second virtual VSS terminal and the ground terminal in response to a second footer control signal;

wherein the first footer control signal is driven by the first power domain, and wherein the second footer control signal is driven by the second power domain.

17. The method of claim 16, wherein the predetermined power mode includes at least one of a normal operation mode, a deep sleep mode, a sleep mode and a shutdown mode, and wherein at least one of the modes is configured to maintain power to one of the first or second power domains and disconnecting power to the other.

18. The method of claim 16, wherein controlling the connection between the first virtual VSS terminal and the ground terminal includes applying the first footer control signal to a first footer circuit connected between the first virtual VSS terminal and the ground terminal, and wherein controlling the connection between the second virtual VSS terminal and the ground terminal includes applying the second footer control signal to a second footer circuit connected between the second virtual VSS terminal and the ground terminal.

19. The method of claim 16, wherein the first and second footer control signals are respectively driven by the first and second power domains includes applying the first and second power domains to respective gates of first and second foot control circuit.

20. The method of claim 16, wherein the first circuit block is a memory array, and wherein the second circuit block is a peripheral circuit.

* * * * *